United States Patent [19]
Nishibori

[11] Patent Number: 5,154,811
[45] Date of Patent: Oct. 13, 1992

[54] APPARATUS AND PROCESS FOR COATING WORKPIECES BY ARC DISCHARGE METHOD IN VACUUM

[76] Inventor: Mineo Nishibori, Am Waldpark 9, 7531 Eisingen, Fed. Rep. of Germany

[21] Appl. No.: 582,360

[22] Filed: Sep. 14, 1990

[30] Foreign Application Priority Data

Sep. 15, 1989 [DE] Fed. Rep. of Germany ....... 3930832

[51] Int. Cl.$^5$ ............................................. C23C 14/32
[52] U.S. Cl. ........................... 204/192.38; 204/298.41; 427/580
[58] Field of Search ...................... 204/192.38, 298.41; 427/37; 118/723

[56] References Cited

U.S. PATENT DOCUMENTS

| | | | |
|---|---|---|---|
| 4,461,799 | 7/1984 | Gavrilov, et al. | 428/210 |
| 4,511,593 | 4/1985 | Brandolf | 427/37 |

FOREIGN PATENT DOCUMENTS

| | | | |
|---|---|---|---|
| 1941254 | 7/1970 | Fed. Rep. of Germany | 427/252 |
| 2820286 | 11/1979 | Fed. Rep. of Germany | 204/298.25 |
| 2167774 | 6/1986 | United Kingdom | 204/192.38 |

*Primary Examiner*—Aaron Weisstuch
*Attorney, Agent, or Firm*—Antonnelli, Terry Stout & Kraus

[57] ABSTRACT

In a typical arc discharge ion plating apparatus, ion-bombardment heating is used for preheating of the workpieces before coating. While this method is simple and effective for heating, such method has many essential problems for vacuum coating films. To improve the vacuum arc discharge coating process, a heating device is provided in the vacuum chamber with the heating device being used instead of ionbombardment heating so that, prior to the vacuum coating, the workpiece is heated up to a temperature in a range of 0.3 to 0.5 of an absolute melting temperature of the coating material of the cathode.

9 Claims, 3 Drawing Sheets

APPARATUS AND PROCESS FOR COATING WORKPIECES BY ARC DISCHARGE METHOD IN VACUUM

FIELD OF INVENTION

The present invention relates to an apparatus for coating workpieces by a vacuum ARC discharge method, with a vacuum chamber and at least one pair of electrodes positioned therein, as well as to a process for coating by a vacuum ARC discharge method.

BACKGROUND OF THE INVENTION

Generally, in an apparatus of the aforementioned type, a vacuum is initially created and then, the workpieces are heated by high energy ion-bombardment of cathode material vaporized by ARC discharge, and then the workpieces are coated by cathode material to the desired thickness of the coating film. The initial layer deposition is very important.

The ion bombardment of the prior technology has many essential problems for films coated by the vacuum ARC discharge.

It is known to coat workpieces, such as cast parts, tools, clock and watch cases, jewelry and the like, by a Ti-cathode in a vacuum. Ti-ions and droplets are evaporated from the Ti-cathode and are accelerated by a high bias potential of approximately DC 1000 V. At the workpiece, the ions release their thermal energy to the workpiece and heat the surface of the workpiece. The mechanism heats the substrate. However, the ions and droplets can migrate and adhere weakly to the surface.

Initially, relatively large particles, such as droplets reach the cold surface, and can be deposited on the surface. It has been found that if, during the further heating up of the surface and during the coating, ions are deposited alongside these particles, some particles can move below the initially deposited particles and force them upwards, so that an empty space forms beneath the same, which impedes coating. This process also initially leads to coarse coating with a limited density and wedge-shaped deposits, accompanied by a rough, uneven surface. Although in the case of further heating, a dense coating may be deposited on the first coating, it reduces the unevenness of the first deposits, quite apart from the fact that, because of the superimposed coatings of different structure, the necessary coating hardness is not achieved and instead easy peeling is possible due to the lower coating.

SUMMARY OF THE INVENTION

The aim underlying the present invention essentially resides in providing an apparatus and process enabling the obtaining of a smooth, dense, hard coating of uniform surface and good adhesion.

According to the invention, a heating device is located in a vacuum chamber of an apparatus of the aforementioned type. Thus, prior to using the ARC discharge for coating purposes, the workpiece is heated to the desired temperature so as to obtain, while avoiding the aforementioned disadvantages and coating errors, a dense, smooth surface coating.

According to the inventive coating process, prior to ARC discharge, the workpiece is heated to a temperature in a range of 0.3 to 0.5 of the absolute melting point of the cathode material. It has been found that, in this range, high density coatings are obtained, in which a columnar coating with thin and close packed columns is produced, which has a surface with only a minor roughness.

Preferably, the heating device is a heat radiator or emitter, because this most effectively transfers the heat produced to the workpiece. The heating device can be a sheath heater.

Since the objective is to heat the workpiece, while the temperature is decreased toward the outside of the vacuum chamber, according to a further development of the invention, temperature reduction means are provided between the heating device and the vacuum chamber wall for reducing the temperature from the heating device to the wall. The temperature reduction means are, in particular, reflector plates, which are made from polished high grade stainless steel. As a result, the thermal radiation can be reflected back into the interior of the vacuum chamber.

According to further developments of the invention, the vacuum chamber contains a thermostat connected to the heating device power supply and, prior to ARC discharge, the workpiece is heated to a temperature in the range of 0.3 to 0.5 of the absolute melting point of the cathode material. As a result, even in the case of the later coating process, the temperature does not assume excessively high values, which high values lead to an irregular surface coating formed by individual crystallites and annealed workpieces.

The inventive apparatus is constructed in a per se known manner in that the interior of the vacuum chamber is connected with a valve leading to a vacuum pump, which produces the vacuum. The outer wall of the chamber can be constructed in a double-wall manner, with cooling fluid circulating in the gap and being cooled by an external heat exchanger.

According to a further development of the process of the invention, the temperature of the workpieces is regulated to a fixed value over the coating period.

BRIEF DESCRIPTION OF THE DRAWINGS

Other advantages and features of the invention can be gathered from the following description of a non-limitative embodiment of the invention with reference to the attached drawings, wherein.

DETAILED DESCRIPTION

Figure 1:
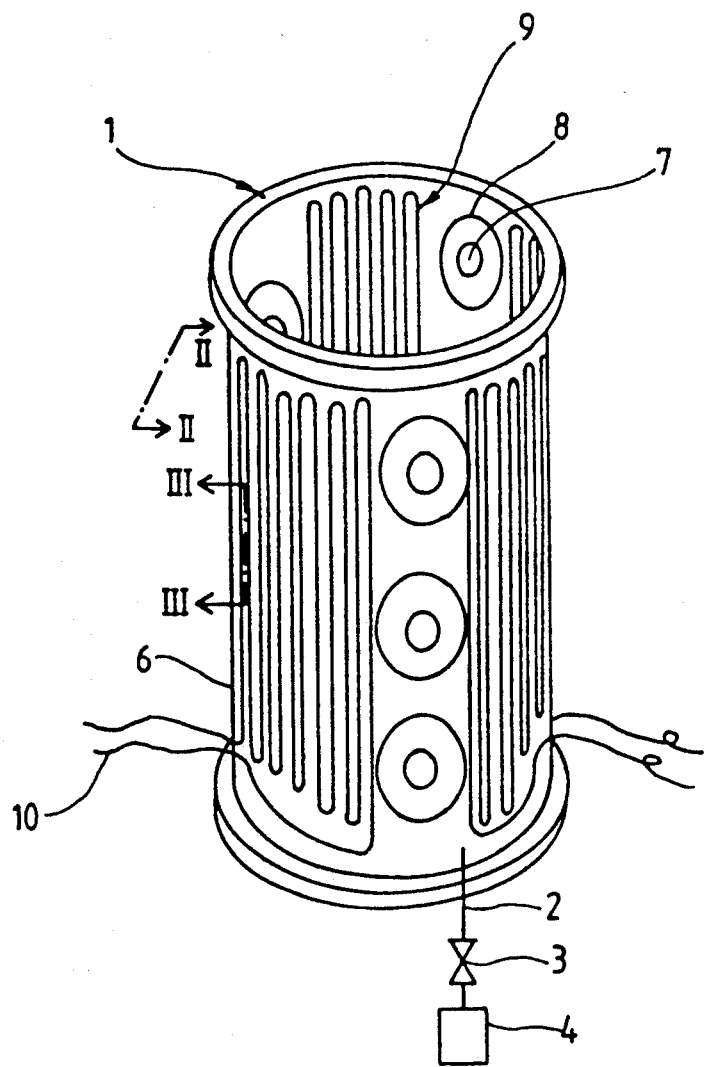
FIG. 1 is a schematic perspective view of a first embodiment of the apparatus constructed in accordance with the present invention.
Figure 2:
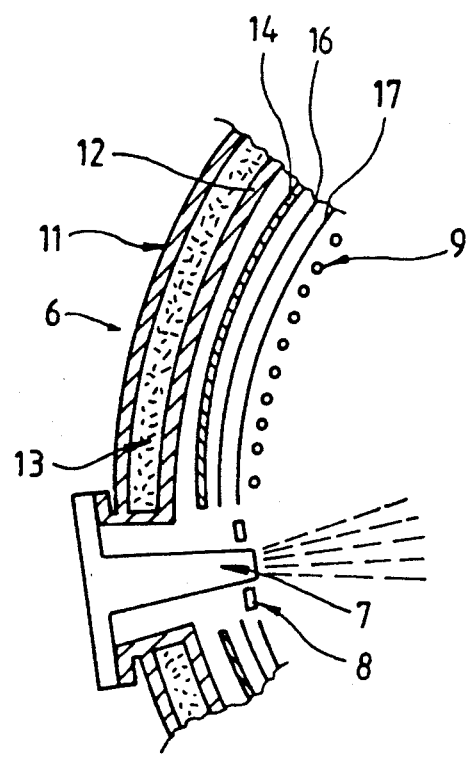
FIG. 2 is a cross-sectional view taken along the line II—II in FIG. 1.
Figure 3:
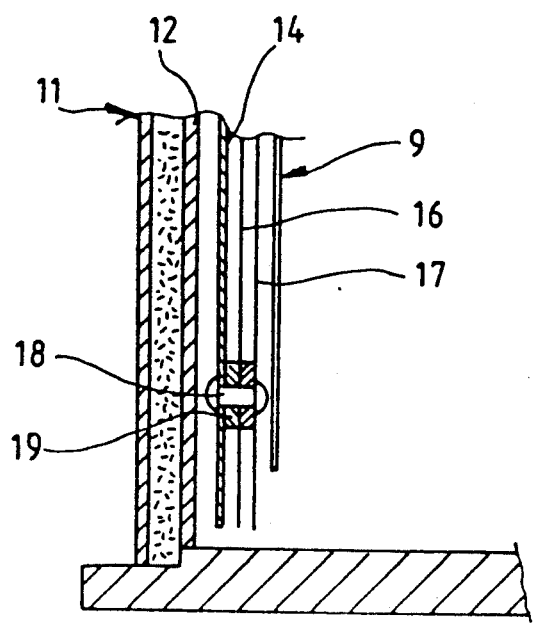
FIG. 3 is a cross-sectional view taken along the line III—III in FIG. 1.

The inventive apparatus for coating workpieces by ARC discharge in vacuum includes a vacuum chamber 1 provided with a vacuum line 2, a valve 3 following the same, and a vacuum pump 4. The vacuum chamber 1 is cylindrical, square or of any other cross section and has a wall 6. A top surface of the vacuum chamber 1 can be sealed in a vacuum-tight manner by a lid (not shown).

Central symmetrical electrodes are provided in the wall of the vacuum chamber 1, with the central symmetrical electrode including an inner cathode 7 and a surrounding anode 8 connected to a power supply. There are several rows of electrodes, preferably, three or more vertical rows of electrodes. Radiant heaters 9 in the form of sheath heaters are provided between the individual electrode rows, with the radiant heaters 9 being connected by connections 10 to a power supply.

The vacuum chamber wall 6 preferably comprises two spaced apart concentric walls 11, 12 defining a gap therebetween, with the gap receiving cooling water 13 circulated by a circulating pump and, optionally, passed over a heat exchanger. Reflectors 14, 16, 17, preferably, made from polished stainless steel are provided between the walls 11 and the radiant heater 9. The reflectors reflect the radiant heat of heater 9 to the inside of the chamber 1 and reduce the heat towards the chamber wall 12. Reflectors 14, 16, 17 are placed on a pin 18 fixed to reflector 14 and are spaced by spacers 19 positioned between them.

The workpiece to be coated, such as a cast part, a tool, a clock case or a piece of jewellery is introduced into the chamber 1 and is secured by a work holder (not shown), which is, preferably, located in the axis of symmetry of the cylindrical vacuum chamber 1 and is rotatable about the same. The work holder may be constructed as a planetary holder with a planetary gear, so that further pivot pins can be arranged around the central pivot pin and the workpieces held thereon rotate about themselves, as well as around the central pin. This is known per se and need not be described in greater detail.

The cathode is, in particular, a titanium cathode for Ti or Ti-N coating.

Figure 4:
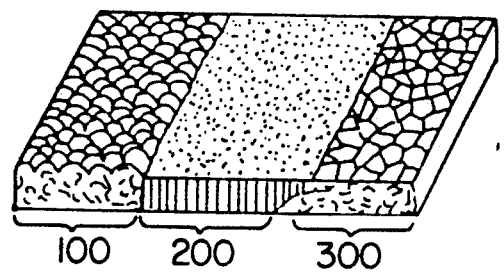
FIG. 4 is a perspective view illustrating the coating structure as a function of the substrate temperature.
Figure 5A:
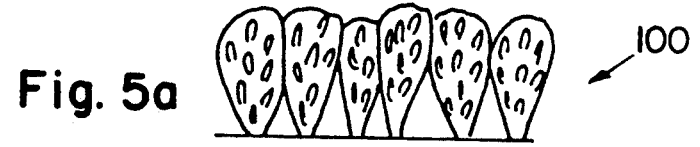
FIGS. 5a–5c are schematic sectional views at right angles to the surface to be coated through the coating in FIG. 4.
Figure 5B:
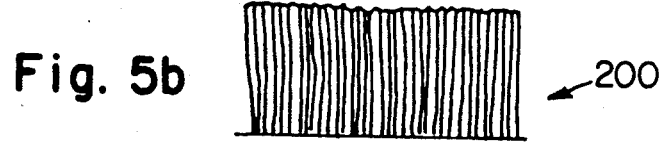
Figure 5C:
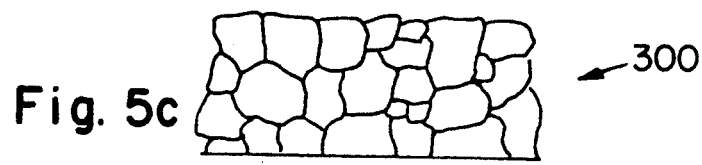

Firstly, the workpiece or workpieces to be coated are introduced into the vacuum chamber 1 and are, for example, suspended on the work holder. The vacuum chamber 1 is then sealed in a vacuum-tight manner and vacuum is produced therein by the vacuum pump 4. The heaters 9 are heated until they emit heat, so that the workpieces are brought to the desired temperature in the range of 0.3 to 0.5 of the melting point of the coating material up to 800° C. (corresponding to 530° C.) in the case of titanium coating. The temperature is kept constant during the following coating process. Coating then takes place by applying a voltage to electrodes 7, 8, preferably, a d.c. voltage of 20 to 40 V. This leads to a gas discharge with an ARC discharge current of about 50 to 80 A. Thus, the Ti-ions and droplets are evaporated from the cathode and as a result of the vacuum have a relatively long free path length and can therefore be deposited on the workpiece. As a result of the inventive process of preheating to a temperature in the range of 0.3 to 0.5 of the melting point of the coating material, a dense columnar crystal structure of the coating material is obtained with a substantially smooth surface with very slight roughness and high material density over 90% (zone 200 in FIGS. 4 and 5b.). However, according to the prior art, which at least initially allows low temperature coating, a coarse-grain film of low density is obtained (zone 100 in FIGS. 4 and 5a). If no temperature regulation is carried out, so that the coating takes place at an excessive temperature, there can be a continuous transition to zone 300 of FIGS. 4 or 5c, the columnar structure disappearing and instead a solid structure being obtained. The crystal plane on the surface assumes a corresponding specific shape. Thus, the inventive procedure leads to a much better and in particular smoother and denser coating and coating surface.

I claim:

1. Apparatus for coating workpieces by vacuum arc discharge, the apparatus comprising a vacuum chamber, at least one pair of electrodes positioned in said vacuum chamber, a heating device disposed in said vacuum chamber for heating said workpieces, and means for reducing heating of a vacuum chamber wall by the said heating means located between the heating means and the wall of the vacuum chamber.

2. A device according to claim 1, wherein the heating means is a heater radiator.

3. A device according to claim 1, wherein the heating means includes a sheath heater.

4. Apparatus according to claim 1, wherein the heating reduction means includes reflector plates.

5. Apparatus according to claim 4, wherein the reflector plates are made from polished stainless steel.

6. Apparatus according to one of claims 4 or 5, wherein spacer means are provided for successively spacing several of the reflector plates.

7. A device according to claim 1, wherein a thermostat connected to a supply for the heating means is arranged in the vacuum chamber.

8. Process for coating workpieces in a vacuum arc discharge apparatus, the process comprising the steps of initially creating a vacuum in a vacuum chamber of the apparatus, heating the workpieces by an independent heating device disposed in the vacuum chamber to a temperature in a range of 0.3 to 0.5 of an absolute melting point of at least one cathode of said apparatus, maintaining said temperature for a requisite time, initiating arc discharge on said at least one cathode, and shielding vacuum chamber walls of the vacuum chamber from heat of the independent heating device.

9. Process according to claim 8, further comprising the step of regulating the temperature of the workpieces during coating to a fixed value.

* * * * *